(12) United States Patent
Kaplun et al.

(10) Patent No.: US 9,417,670 B2
(45) Date of Patent: Aug. 16, 2016

(54) HIGH POWER DISSIPATION MEZZANINE CARD COOLING FRAME

(75) Inventors: Brian Kaplun, Endicott, NY (US); Boris Yost, Endicott, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 734 days.

(21) Appl. No.: 13/568,223

(22) Filed: Aug. 7, 2012

(65) Prior Publication Data
US 2014/0043753 A1  Feb. 13, 2014

(51) Int. Cl.
*G06F 1/20* (2006.01)
*G06F 1/18* (2006.01)

(52) U.S. Cl.
CPC ........ *G06F 1/20* (2013.01); *G06F 1/185* (2013.01); *H01L 2924/00* (2013.01)

(58) Field of Classification Search
CPC ........... H01L 2924/00; H01L 2224/32225; H01L 2224/16225; H01L 2924/00014; G06F 1/185; G06F 13/409; G06F 1/20; G06F 1/206
USPC ............. 361/679.54, 690, 707, 720, 722
See application file for complete search history.

(56) References Cited

U.S. PATENT DOCUMENTS

| | | | |
|---|---|---|---|
| 5,999,407 A * | 12/1999 | Meschter et al. | 361/704 |
| 6,023,412 A * | 2/2000 | Morita | 361/690 |
| 6,064,575 A * | 5/2000 | Urda et al. | 361/721 |
| 6,101,094 A * | 8/2000 | Kermaani | H05K 1/141 165/185 |
| 6,212,075 B1 | 4/2001 | Habing et al. | |
| 6,239,972 B1 | 5/2001 | Tehan et al. | |
| 6,246,582 B1 | 6/2001 | Habing et al. | |
| 6,392,891 B1 | 5/2002 | Tzlil et al. | |
| 6,721,182 B1 | 4/2004 | Wells et al. | |
| 2004/0070944 A1* | 4/2004 | Wells | H05K 7/1404 361/704 |
| 2004/0114331 A1* | 6/2004 | Hines et al. | 361/719 |
| 2004/0212953 A1* | 10/2004 | Summers et al. | 361/600 |
| 2009/0052139 A1* | 2/2009 | Lai | H01L 23/467 361/707 |
| 2010/0177487 A1* | 7/2010 | Arshad et al. | 361/737 |

* cited by examiner

*Primary Examiner* — Adam B Dravininkas
(74) *Attorney, Agent, or Firm* — Wolf, Greenfield & Sacks, P.C.

(57) ABSTRACT

Some embodiments are directed to cooling frames for mezzanine cards, mezzanine card assemblies and circuit card assemblies. A recessed cooling frame may be used to dissipate heat generated by components of a mezzanine card. The cooling frame may be directly coupled to a host card or host card cooling frame, thereby reducing the number of interfaces and reducing the thermal resistance of the heat dissipation pathway. The cooling frames of some embodiments may provide more efficient heat dissipation and thereby allow higher performance mezzanine cards to be used. Some embodiments provide a mezzanine card assembly that conforms to the mechanical envelope dimensions of the VITA 20, VITA 42 or VITA 61 specifications.

18 Claims, 7 Drawing Sheets

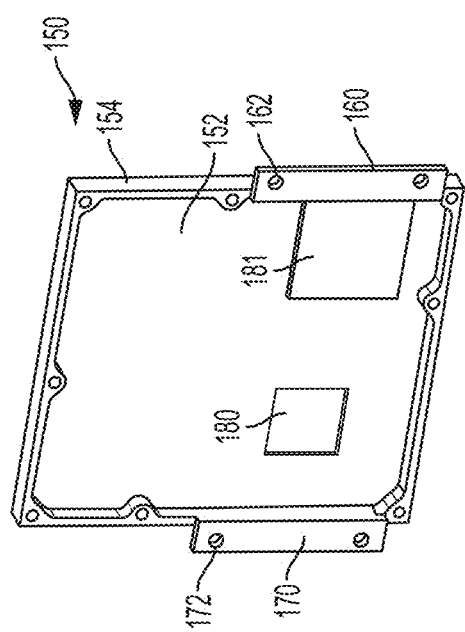
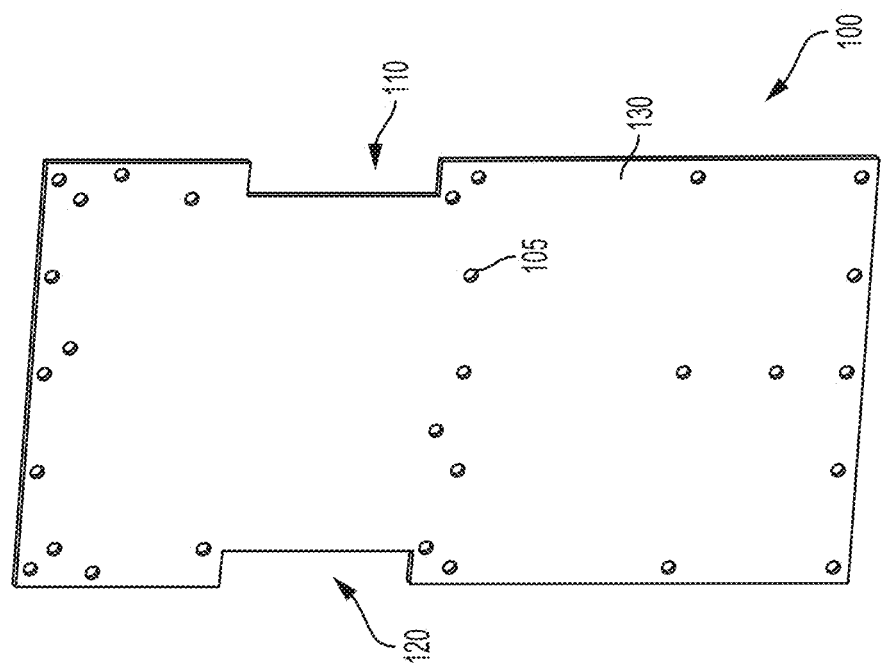
FIG. 1B
FIG. 1A

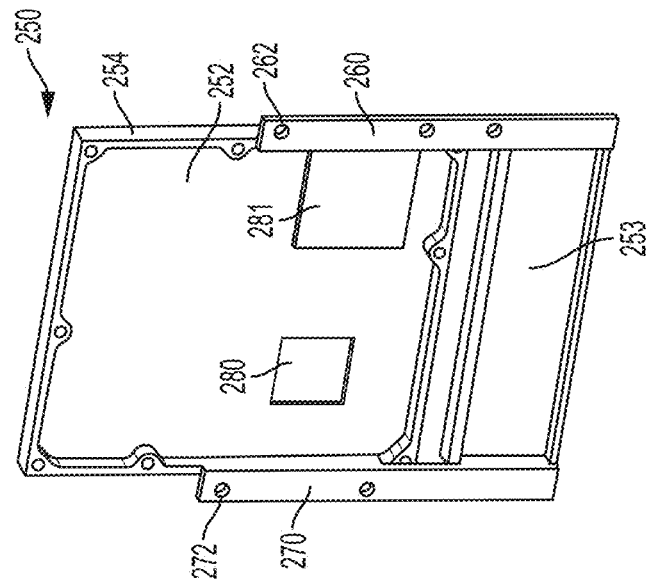
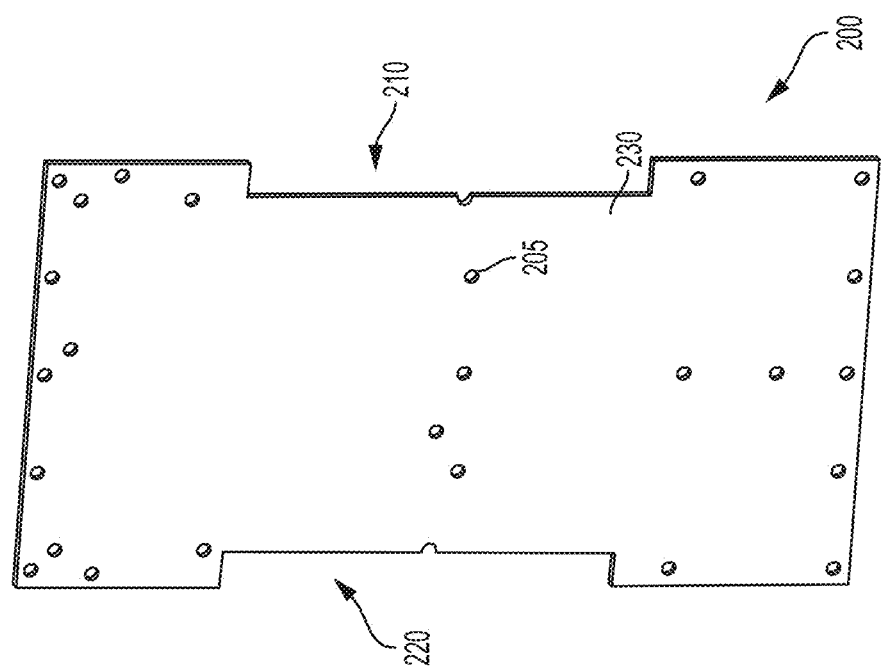
FIG. 2B
FIG. 2A

HIGH POWER DISSIPATION MEZZANINE CARD COOLING FRAME

BACKGROUND OF INVENTION

The techniques described herein relate to a cooling frame for a mezzanine card for use in connection with a host card. The cooling frame and mezzanine card allow for high power heat dissipation.

Circuit card modules are used in many areas of computing and frequently utilize mezzanine cards and cooling frames. Standard bodies, such as the VMEbus International Trade Association ("VITA") have developed both electrical and mechanical specifications to which most manufacturers adhere. Customers often prefer standardized components because it ensures compatibility between various products purchased from different vendors. Accordingly, most manufacturers adhere to the above standards for circuit card modules and/or mezzanine cards.

Circuit card modules may comprise printed circuit boards (PCBs) or printed wiring boards (PWBs), terms that are often used interchangeably. Electronic components, such as integrated circuits and processors, may be affixed to the boards. Mezzanine cards are PWBs that may be attached both mechanically and electrically to a host card. As the processors and integrated circuits that are affixed to mezzanine cards increase in performance, there arises a need for efficient, high power dissipation of the heat generated by these components.

Previous heat dissipation solutions transfer heat from the mezzanine card components to a top cooling frame, then to the mezzanine card PWB, and then finally to the host card frame.

BRIEF SUMMARY OF INVENTION

Some embodiments are directed to a mezzanine card assembly comprising a mezzanine card of a non-rectangular shape. The mezzanine card may have a a first mezzanine surface with at least one component mounted thereto and a second mezzanine surface opposing the first mezzanine surface. The mezzanine card assembly may also comprise a cooling frame, wherein joint dimensions of the cooling frame and the mezzanine card together conform to a standard dimensions requirements, for example VITA 20, VITA 42, VITA 61, etc. . . . . The at least one component is in direct thermal contact with the cooling frame, which may be formed from a metallic material. The cooling frame may comprise at least one protrusion with a first protrusion surface at a first level defined by the second mezzanine surface and a second protrusion surface opposing the first protrusion surface. The PWB may comprise at least one cut-out portion configured to receive the at least one protrusion of the cooling frame. In some embodiments, the second protrusion surface is at a second level defined by the first mezzanine surface.

In some embodiments, the at least one protrusion is substantially rectangular. The at least one protrusion may comprise at least one hole for receiving attachment hardware, the at least one hole configured so that the attachment hardware mounts the cooling frame to a host card and/or a host card frame. Some embodiments may use at least one cooling pad comprising a first pad surface in contact with the cooling frame and a second pad surface, opposing the first pad surface, wherein the second pad surface is in contact with the at least one component.

Some embodiments are directed to a metallic frame for cooling a mezzanine card. The metallic frame may comprise a main body that is substantially rectangular comprising at least a first main body surface, wherein the main body is at a first level. The metallic frame may also comprise at least one protrusion at a second level other than the first level, wherein the at least one protrusion comprising at least a first protrusion surface. There may also be at least one sidewall connecting the main body to the at least one protrusion, wherein the at least one sidewall comprises at least a first sidewall surface, wherein the first sidewall surface is connected to the first main body surface and the first protrusion surface. In some embodiments, the first sidewall surface may be connected substantially perpendicular to the first main body surface and the first protrusion surface. The at least one protrusion may comprise at least one hole for receiving attachment hardware, the at least one hole configured so that the attachment hardware mounts the frame to a host card.

The metallic frame may also comprise a secondary body comprising at least a first secondary body surface substantially parallel to the first main body surface, wherein the secondary body is coupled to the main body by at least the at least one protrusion. The at least one protrusion may be configured to fit into a cut-out in a printed wiring board (PWB). A first thickness of the at least one protrusion may be configured to be substantially equal to a second thickness the PWB, wherein the first thickness and the second thickness are in the direction of the at least one sidewall.

Some embodiments are directed to a circuit card assembly comprising a host card, a mezzanine card and a cooling frame. The mezzanine card may be substantially parallel to the host card and comprise a first mezzanine surface with at least one component mounted thereto and a second mezzanine surface opposing the first mezzanine surface. The mezzanine card may be non-rectangular. The cooling frame may be in contact with the host card, wherein the cooling frame and the mezzanine card together have joint dimensions conforming to dimensions of a standard. The standard may be a VITA 20 standard, a VITA 42 standard, a VITA 61 standard or an IEEE standard.

The cooling frame may comprise at least one protrusion comprising a first protrusion surface at a first level defined by the second mezzanine surface and a second protrusion surface opposing the first protrusion surface. The mezzanine card may comprise at least one cut-out portion configured to receive the at least one protrusion of the cooling frame. The second protrusion surface may be at a second level defined by the first mezzanine surface. The cooling frame may further comprise a main body and a secondary body connected to the main body by the at least one protrusion, wherein the secondary body is substantially parallel to the main body. The mezzanine board may have at least one component in contact with the main body and at least one additional component in contact with the secondary body.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1A illustrates a first exemplary mezzanine card;

FIG. 1B illustrates a first exemplary cooling frame for the first exemplary mezzanine card;

FIG. 2A illustrates a second exemplary mezzanine card;

FIG. 2B illustrates a second exemplary cooling frame for the second exemplary mezzanine card;

DETAILED DESCRIPTION OF INVENTION

Figure 1C:
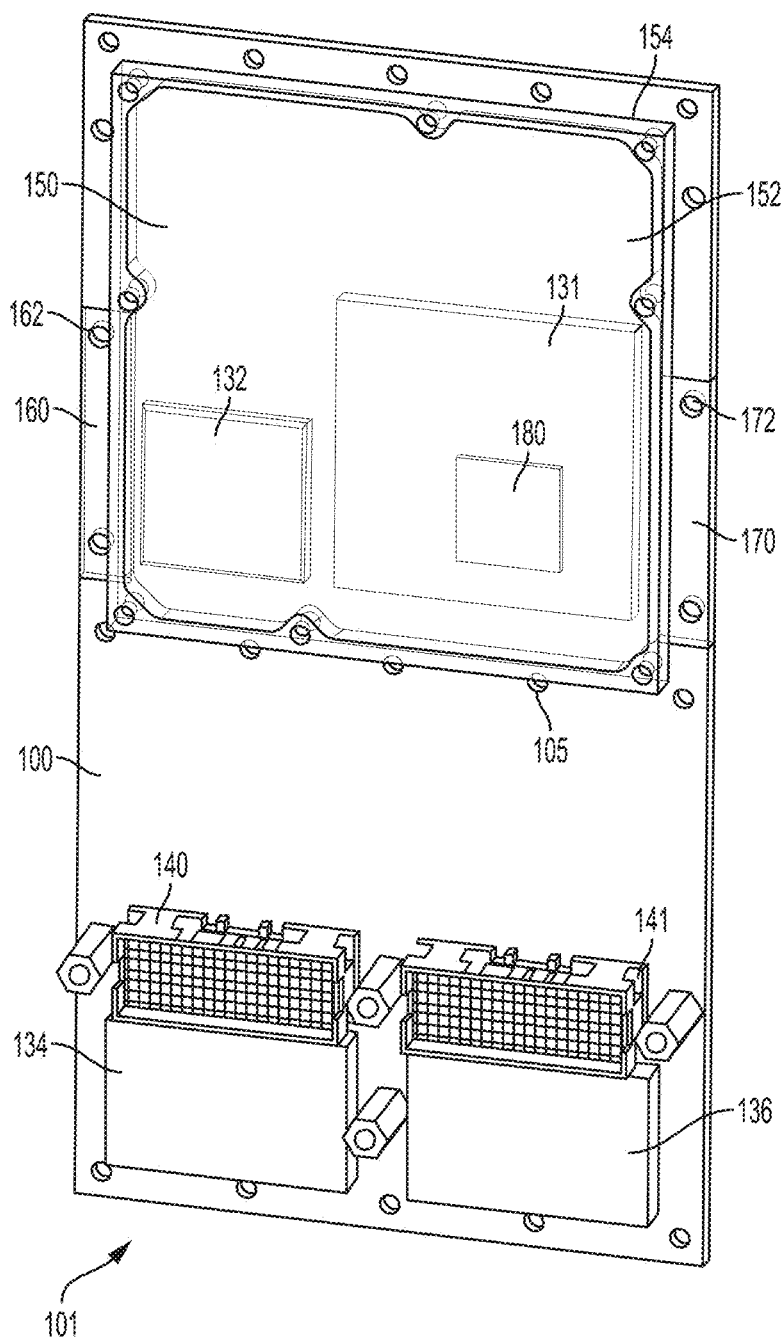
FIG. 1C illustrates the first exemplary mezzanine card and first exemplary cooling frame together as a first mezzanine card assembly.

The inventors have recognized and appreciated that one of the factors limiting performance of mezzanine cards and the components thereon is the ability to dissipate the heat generated during operation. Heat may be more efficiently transferred away from the components of a mezzanine card by reducing the number of interfaces between the hot components and a heat sink. Moreover, heat dissipation can be made more efficient through the primary usage of lower impedance thermal conduction materials, such as metallic interfaces as opposed to standard PWB construction. The inventors have recognized and appreciated that more efficient heat dissipation permits higher operating temperatures for mezzanine cards, higher performance, and/or longer lifetime of the components thereon with no other changes to the architecture.

The ability to transfer heat may be increased by reducing the number of interfaces heat must traverse. Thermal resistance of a heat path increases with the number of interfaces. Moreover, conducting the heat through highly conductive materials, such as metal, greatly increases the ability to dissipate heat. Accordingly, some embodiments of the invention are directed to techniques for directly thermally coupling a metallic cooling frame of a mezzanine card to the host card and/or a cooling frame associated with the host card, bypassing the need to transfer heat through the relatively low conductivity PWB of the mezzanine card. To achieve this direct coupling, some embodiments replace a thermal interface area of the PWB with a recessed metallic frame that both top cools the mezzanine card components and dissipates heat directly to the host card.

There are a variety of standards for circuit card modules. For example, VITA 61, VITA 42 and VITA 20 define mechanical and electrical specifications for a switched mezzanine card (XMC) and PCI (Peripheral Component Interface) Mezzanine Card (PMC), respectively. The standards each define a standoff height and a mechanical envelope to which mezzanine cards must adhere. A mechanical envelope may be a set of dimensions to which a mezzanine card assembly must adhere. There are many off-the-shelf components that are designed to work with cards abiding by these standards, such as connectors that match the standoff height. Therefore, some embodiments comprise a mezzanine card and cooling frame that together conform to the mechanical envelope and standoff height dictated by the VITA standards. A mezzanine card and a cooling frame together may be referred to as a mezzanine card assembly. A mezzanine card assembly may also include additional components. Similarly a circuit card assembly may refer to a host card and a mezzanine card assembly. A computer card assembly may also include additional components, including a cooling frame associated with the host card.

Embodiments of the invention are not limited to VITA standards. Other standard bodies exist for defining circuit card dimensions. For example, some embodiments are based on a IEEE specification of dimensions.

FIG. 1A shows an exemplary mezzanine card 100 illustrative of some embodiments. The mezzanine card 100 may comprise a PWB and one or more components (not shown in FIG. 1A). The components may include processors, integrated circuits or any other suitable electrical component. The mezzanine card 100 has two surfaces, surface 130 is shown in FIG. 1A and there is a second surface opposing surface 130 not shown in FIG. 1A. Components may be mounted to one or both surfaces of the mezzanine card 100. The distance between the first surface 130 and the second surface determines the thickness of the PWB of the mezzanine card.

In some embodiments, the mezzanine card 100 is non-rectangular in shape. Any suitable shape may be used. FIG. 1A illustrates an "I-shaped" mezzanine card 100 with a rectangular PWB with two rectangular "cut-outs" 110 and 120 along the long edge of the PWB. The cut-outs 110 and 120 are voids in the PWB of the mezzanine card 100. The cut-outs 110 and 120 need not be precisely rectangular. For example, the corners of the rectangle may be rounded in any suitable way such that cut-outs are substantially rectangular. Embodiments are not limited to two cut-outs. For example, some embodiments may use four cut-outs—two along each long side of the PWB. Embodiments are not limited to any size, shape or number of cut-outs. The VITA standards define a rectangular envelope to which the dimensions of mezzanine card assemblies must conform. While the mezzanine card 100 does not adhere to the defined standard mechanical envelope due to the cut-outs 110 and 120, as will be seen in connection with FIG. 1C below, the mezzanine card 100 together with cooling frame 150 conform to the specified mechanical envelope of a particular standard.

The standard may also mandate the location and size of at least one hole 105 through the mezzanine card 100. Attachment hardware may be placed through the hole to attach the mezzanine card 100 to the host card.

FIG. 1B shows an exemplary cooling frame 150 illustrative of some embodiments. The cooling frame 150 may be placed in thermal contact with components of mezzanine board 100 in order to dissipate heat generated during the operation of said components. The cooling frame 150 is preferably made of a material with a high thermal conductivity. For example, any metal or metal alloy may be used, such as aluminum or copper. Alternatively, one or more thermally conductive polymers may be used to dissipate heat. Embodiments are not limited to any particular material. In some embodiments the cooling frame 150 is made from a single, integral piece of metal.

Cooling frame 150 may be any suitable shape that, when combined with the shape of mezzanine card 100 conforms to the mechanical envelope and standoff height defined by particular standards. FIG. 1B illustrates a cooling frame 150 with a relatively large, single main body 152. The main body 152 may be placed in thermal contact with components of mezzanine card 100 in order to dissipate heat therefrom. The main body 152 may be substantially rectangular, substantially flat and substantially parallel to the surfaces of the mezzanine card 100. In some embodiments, main body 152 may include cooling pedestals 180-181 designed to adjust the specific height of the main body at particular locations that correspond to a location of a component mounted to mezzanine card 100. Cooling pedestals 180-181 need not be present in embodiments and, if they are, the size and shape are not limited in any way.

A sidewall 154 may run around the perimeter of main body 152. The sidewall 154 determines the level at which the main body 152 sits relative to the components of mezzanine card 100 and must allow the form factor of the mezzanine card assembly to fit within the maximum material condition in the selected standard. The sidewall 154 may be any suitable thickness. The sidewall thickness must be enough to accommodate a variety of bolt holes that are mandated by the standard. However, as the sidewall 154 is made thicker, there will be less room for components on mezzanine card 100 under main body 152. Accordingly, in some embodiments, the sidewall will be thicker near the bolt holes and thinner where there are no bolt holes.

The sidewall 154 connects main body 152 to protrusions 160 and 170. Protrusions of the cooling frame 150 may be referred to as wings, ears or tabs. Cooling frame 150 may comprise any suitable number of protrusions. The number and shape of the protrusions may match the number and shapes of the cut-outs of mezzanine card 100. Protrusions 160 and 170 comprise a first surface and a second surface opposing the first surface. The first and second surface of protrusions 160 and 170 may be substantially parallel to the surfaces of main body 152. The distance between the first and second surface of the protrusions defines the thickness of the protrusions. As will be discussed in connection with FIG. 4 below, in some embodiments the thickness of the protrusions may be the same as the thickness of the PWB of the mezzanine card.

In some embodiments, protrusions 160 and 170 may comprise at least one hole 162 and 172, respectively. Holes 162 and 172 may receive attachment hardware, such as screws or bolts. The location and size of the holes 162 and 172 may be mandated by, for example, the VITA specification. Any suitable number of holes may be in each protrusion. For example, FIG. 1B illustrates protrusions 160 and 170 with two holes each.

FIG. 1C illustrates the mezzanine card 100 and cooling frame 150 fitted together to form a mezzanine card assembly 101 in accordance with some embodiments of the invention. Protrusions 160 and 170 of cooling frame 150 may be fitted into cut-outs 110 and 120 of the mezzanine card 100, respectively. Together, the mezzanine card 100 and the cooling frame 150 may conform to the rectangular envelope mandated by the VITA standard. Also, the cooling frame 150 may be designed such that it does not interfere with the at least one hole 105 required for attachment hardware, as mandated by the VITA standard.

FIG. 1C also illustrates components 131-132 of mezzanine card 100. In some embodiments, the components 131-132 may be in direct contact with cooling frame 150, allowing efficient heat dissipation away from the components. In other embodiments, cooling pads 135 (illustrated in FIG. 5) may be placed between the components 131-132 and the cooling frame to facilitate thermal coupling. A cooling pad may comprise a first surface in contact with one or more of the components 131-132 and a second surface, opposed to the first surface, in contact with the main body 152 of the cooling frame 150. The heat from components 131-132 may travel through the main body 152 to protrusions 160 and 170. The protrusions 160 and 170 may be directly attached to the host card (not shown) via attachment hardware through holes 162 and 172, respectively. This allows direct flow of heat from the cooling frame to the host card without the need for heat to dissipate through the PWB of mezzanine card 100.

For illustrative purposes, FIG. 1C also shows additional components 134 and 136 that do not dissipate heat through the cooling frame 150. Also shown are connectors 140-141, which may be used to electrically couple the mezzanine card 100 to the associated host card. Mezzanine card 100 may comprise additional components, either under main body 152 or not under the main body 152, which are not shown for purposed of clarity.

FIG. 2A illustrates a second mezzanine card 200 according to some embodiments of the invention. Many aspects of mezzanine card 200 may be similar to mezzanine card 100. For example, mezzanine card 200 has a first surface 230, a second surface opposed to the first surface, and mezzanine card 200 is non-rectangular due to two cut-outs 210 and 220. Cut-outs 210 and 220 are larger than cut-outs 110 and 120 of mezzanine card 100. This may provide additional direct thermal coupling of the mezzanine card to the host card. Also, as illustrated in FIG. 2B, it allows the cooling frame 250 to have additional areas to which components of the mezzanine card may dissipate heat.

The standard may mandate the location and size of at least one hole 205 through the mezzanine card 200. Attachment hardware may be placed through the hole to attach the mezzanine card 200 to the host card.

FIG. 2B shows a second exemplary cooling frame 250 illustrative of some embodiments. There are many similarities between cooling frame 250 and cooling from 150. For example, cooling frame 250 may have a main body 252, a sidewall 254, cooling pedestals 280-281, protrusions 260 and 270, and holes 262 and 272. Certain aspects of these components are the same as the corresponding components of cooling from 150 and are not repeated.

Protrusions 260 and 270 are longer than protrusions 160 and 170. This additional surface area may provide additional direct thermal contact to the host card. The longer protrusions 260 and 270 allow for cooling frame 250 to have an a secondary body 253, which may be smaller than main body 252. The secondary body 253 may be attached to the main body 252 by the protrusions 260 and 270. The secondary body 253 may be substantially parallel to main body 252 and at the same height, wherein the height of each of the bodies may be defined as the distance from the PWB of the mezzanine card 200 to one of the surfaces of the body. In some embodiments, the height of the secondary body 253 may be different from the height of main body 252. There may be a gap between the main body 252 and the secondary body 253. This gap may be any size, but as discussed below in connection with FIG. 2C, it must be large enough to accommodate the at least one hole 205 in mezzanine card 200 mandated by the VITA standard.

Figure 2C:
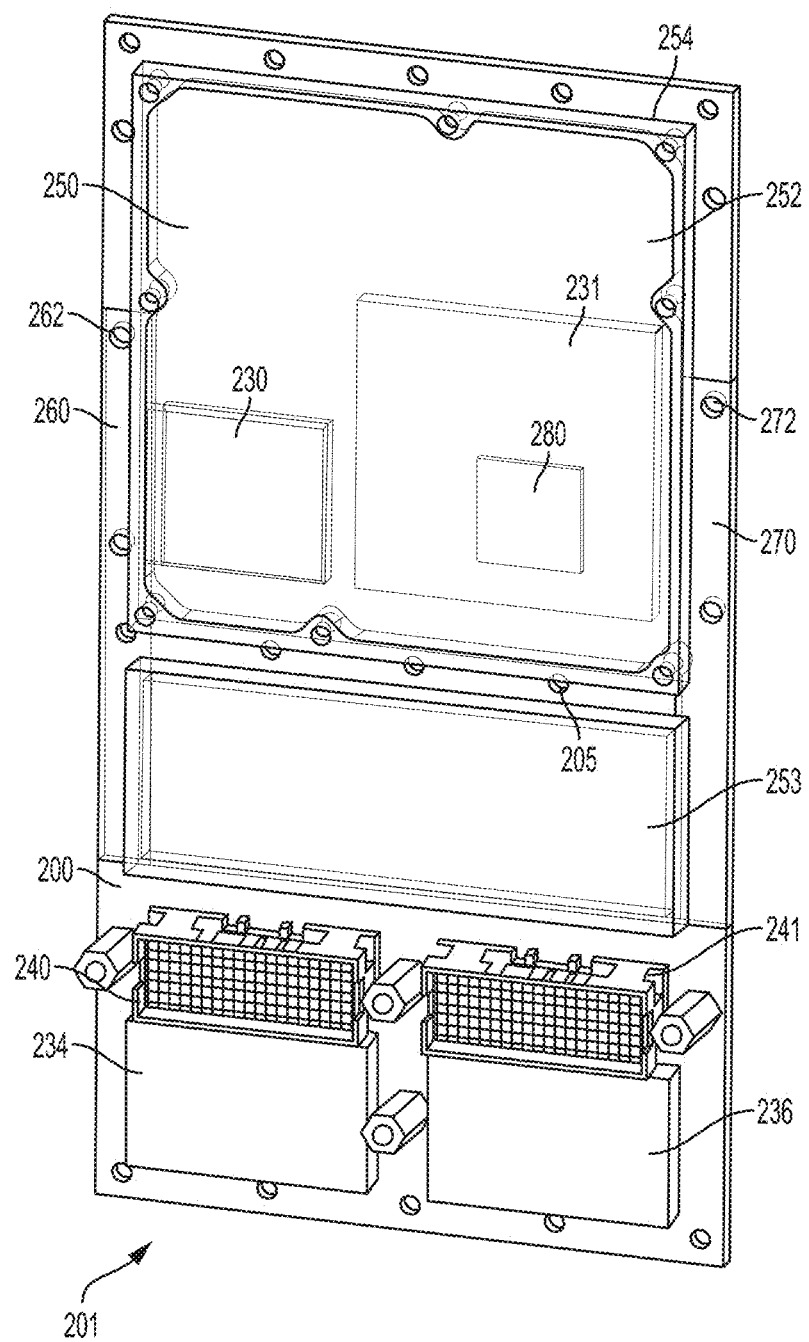
FIG. 2C illustrates the second exemplary mezzanine card and the second exemplary cooling frame together as a second mezzanine card assembly.

FIG. 2C illustrates the mezzanine card 200 and the cooling frame 250 fitted together to form a mezzanine card assembly 201 in accordance with some embodiments of the invention. Protrusions 260 and 270 of cooling frame 250 may be fitted into cut-outs 210 and 220 of the mezzanine card 200, respectively. Together, the mezzanine card 200 and the cooling frame 250 may conform to the rectangular mechanical envelope mandated by the VITA standard.

FIG. 2C also illustrates components 230-231 of mezzanine card 200. In some embodiments, the components 230-231 may be in direct contact with cooling frame 250, allowing efficient heat dissipation away from the components. In other embodiments, cooling pads 135 (illustrated in FIG. 5) may be placed between the components 230-231 and the cooling frame to facilitate thermal coupling. The heat from components 230-231 may travel through the main body 252 to protrusions 260 and 270. The protrusions 260 and 270 may be directly attached to the host card (not shown) via attachment hardware through holes 262 and 272, respectively. This allows direct flow of heat from the cooling frame to the host card without the need for heat to dissipate through the PWB of mezzanine card 200.

Not shown in FIG. 2C are additional components that may be on the surface of mezzanine card 200 under the secondary body 253. Just as components 230-231 may be in contact with main body 252, additional components may be in contact with secondary body 253. The heat created by the additional components is carried away from the components by the secondary body 253 and transferred to the host card via protrusions 260 and 270. The secondary body 253 may be separated from main body 253 to allow a gap between the bodies to accommodate the at least one hole 205 required by the VITA specification.

For illustrative purposes, FIG. 2C also shows additional components 234 and 236 that do not dissipate heat through the cooling frame 150. Also shown are connectors 240-241, which may be used to electrically couple the mezzanine card 200 to the associated host card. Mezzanine card 200 may comprise additional components, either under main body 252 or not under the main body 252, which are not shown for purposed of clarity.

Figure 3:
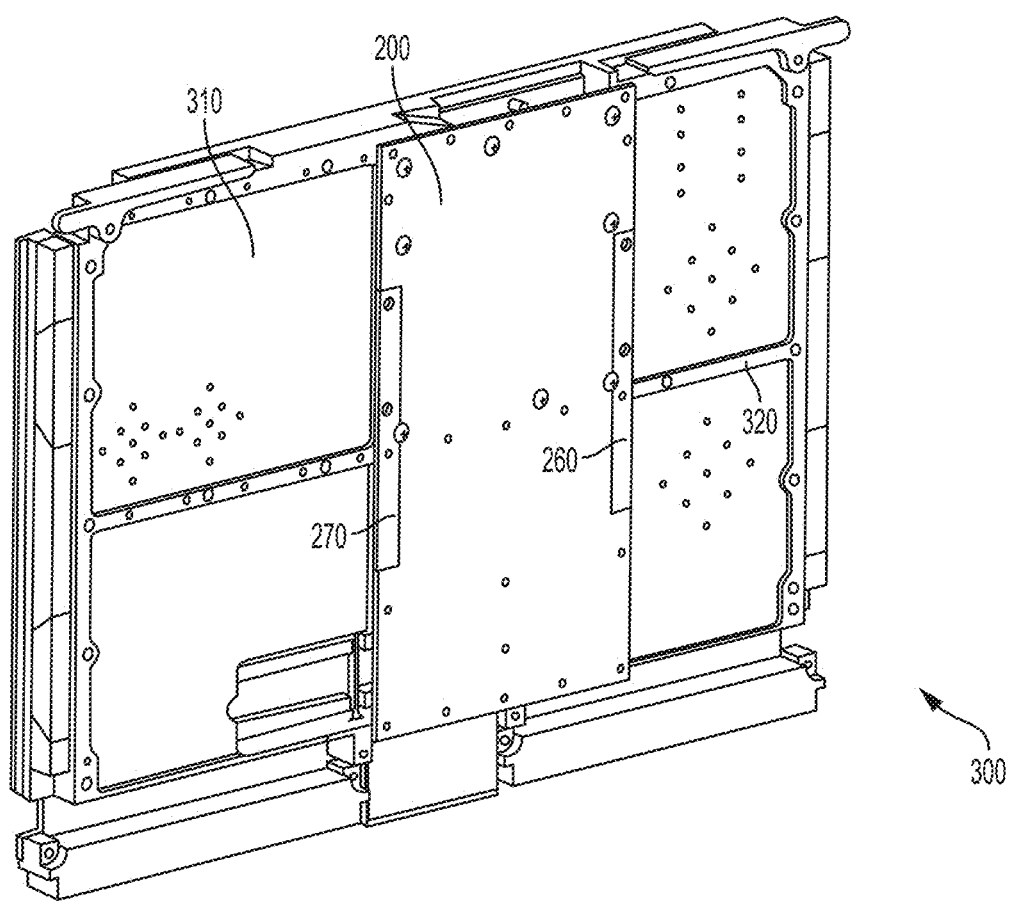
FIG. 3 illustrates the second exemplary mezzanine card assembly attached to a host card.

FIG. 3 illustrates a circuit card assembly 300 comprising the mezzanine card 200, cooling frame 250 (only protrusions 260 and 270 are visible in the drawing), host card 310, and host card cooling frame 320. In some embodiments, the size of the mezzanine card assembly 201 may be mandated by a mechanical envelope defined in a VITA specification. The mezzanine card assembly 201 comprises the mezzanine card 200 and the cooling frame 250. The cooling frame 250 may be mounted directly to the host card 310 and/or the host card cooling frame 320 using attachment hardware (not shown).

The host card 310 may be one of a plurality of host cards that are interconnected using a backplane of a larger computing device. The host card 310 may dissipate heat in any suitable way. For example, in military applications, the host card may be conduction cooled by being thermally coupled to the host card cooling frame 320. The host card cooling frame 320 may ultimately be coupled to a larger metal chassis that dissipates the heat transferred from the mezzanine card 200 and the host card 310. Conduction cooling may be preferred in military applications, such as military avionics, where the device must operate in harsh environments and air-flow over the electronic components must be prevented. Other embodiments may use air flow cooling of the components. Embodiments are not limited to a particular method of heat dissipation.

Host card cooling frame 320 may be considered part of host card 310. The cooling frame 320 not only provides a means for dissipating heat generated by the host card, but it also provides structure and support to host card 310. Similarly the cooling frames 150 and 250 associated with mezzanine cards 100 and 200, respectively, also provide support and structure to the mezzanine cards.

Figure 4:
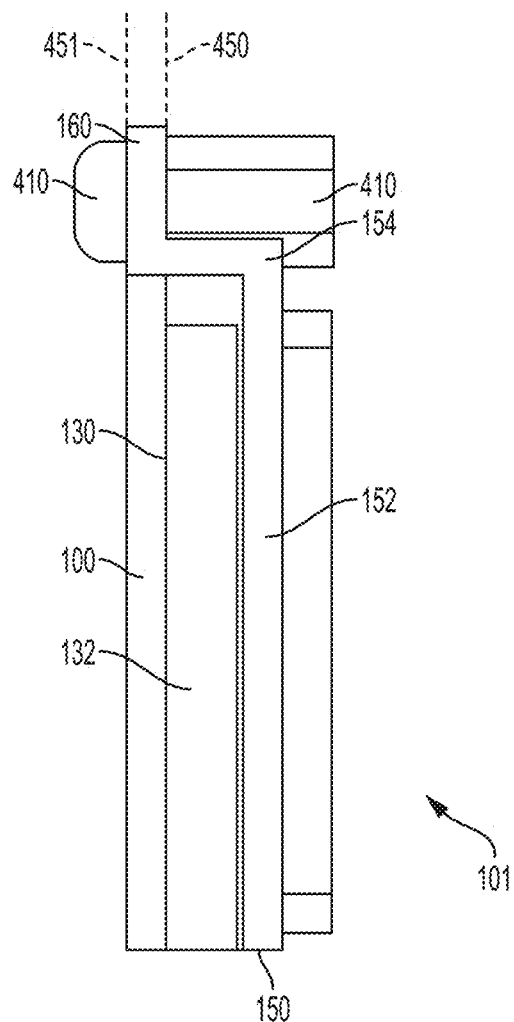
FIG. 4 illustrates a close up cross-section of the first mezzanine card assembly.
Figure 5:
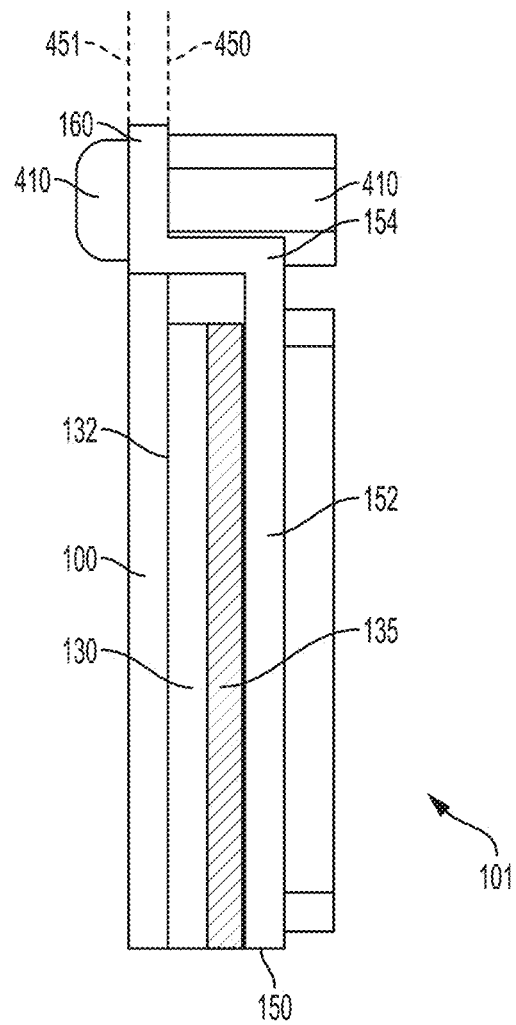
FIG. 5 illustrates a close up cross-section of the first mezzanine card assembly.

FIG. 4 and FIG. 5 illustrate a close-up cross-section of mezzanine card assembly 101, which comprises mezzanine card 100 and cooling frame 150. Component 132 is mounted to mezzanine card 100 and is in direct thermal contact with the main body 152 of cooling frame 150 in FIG. 4. In FIG. 5, an embodiment where a cooling pad 135 is placed between the component 132 and the cooling frame 150 to facilitate thermal coupling. The cooling pad includes a first pad surface in contact with the cooling frame 150 and a second pad surface, opposing the first pad surface, in contact with the at least one component 132. Protrusion 160 may have a thickness defined by the level 450 of a first surface and level 451 of a second surface. In some embodiments, this thickness is the same thickness as sidewall 154 and main body 152. In some embodiments, the PWB of mezzanine card 100 has the same thickness defined by levels 451 and 450. Surface 130 of the mezzanine card's PWB may be at the same level 450 as the first surface of protrusion 160. By being at the same level 450, the cooling frame 150 together with the mezzanine card 100 adhere to the VITA specification mechanical envelope dimensions.

Attachment hardware 410 may be used to mount the cooling frame 150 via protrusion 160 to the host card and/or the host card's cooling frame. Any suitable attachment hardware 410 may be used. For example, attachment hardware 410 may be a bolt or a screw.

Embodiments of the invention have been described with reference to the VITA standard, particularly the VITA 20, VITA 42 and VITA 61 specifications. Embodiments of the invention are not so limited and any circuit card module standard may be used. For example, a IEEE standard may be used.

This invention is not limited in its application to the details of construction and the arrangement of components set forth in the foregoing description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A mezzanine card assembly comprising:
   a mezzanine card of a non-rectangular shape, the mezzanine card comprising:
      a first mezzanine surface with at least one component mounted thereto; and
      a second mezzanine surface opposing the first mezzanine surface; and a mezzanine card cooling frame configured to be directly thermally coupled to a host card cooling frame of a host card having a single-printed wiring board structure, wherein joint dimensions of the mezzanine card cooling frame and the mezzanine card together conform to a standard dimensions requirements, wherein the mezzanine card cooling frame comprises:
a main body;
at least one protrusion; and
at least one sidewall connecting the main body to the at least one protrusion, wherein the at least one protrusion is configured to fit into a cut-out in a single-printed wiring board, wherein a first thickness of the at least one protrusion is configured to be substantially equal to a second thickness of the single-printed wiring board, and wherein the first thickness and the second thickness are in the direction of the at least one sidewall.

2. The mezzanine card of claim 1, wherein:
the at least one protrusion comprises:
a first protrusion surface at a first level defined by the second mezzanine surface; and
a second protrusion surface opposing the first protrusion surface; and
the mezzanine card comprises at least one cut-out portion configured to receive the at least one protrusion of the mezzanine card cooling frame.

3. The mezzanine card of claim 2, wherein the second protrusion surface is at a second level defined by the first mezzanine surface.

4. The mezzanine card of claim 2, wherein the at least one protrusion is substantially rectangular.

5. The mezzanine card of claim 2, wherein the at least one protrusion comprises at least one hole for receiving attachment hardware, the at least one hole configured so that the attachment hardware mounts the mezzanine card cooling frame to the host card cooling frame.

6. The mezzanine card of claim 1, wherein the standard is a VITA standard.

7. The mezzanine card of claim 1, wherein the at least one component is in direct thermal contact with the mezzanine card cooling frame.

8. The mezzanine card of claim 1, further comprising:
at least one cooling pad comprising:
a first pad surface in contact with the mezzanine card cooling frame; and
a second pad surface, opposing the first pad surface, wherein the second pad surface is in contact with the at least one component.

9. The mezzanine card of claim 1, wherein the mezzanine card cooling frame is formed from a metallic material.

10. A metallic frame for cooling a mezzanine card, the metallic frame comprising:
a main body comprising at least a first main body surface configured to be placed in thermal contact with at least one component of the mezzanine card, wherein the main body is at a first level;
at least one protrusion at a second level other than the first level, the at least one protrusion comprising at least a first protrusion surface; and
at least one sidewall connecting the main body to the at least one protrusion, the at least one sidewall comprising at least a first sidewall surface, wherein the at least one protrusion comprises at least one hole for receiving attachment hardware, the at least one hole being configured so that the attachment hardware mounts the metallic frame to a host card cooling frame of a host card so that the metallic frame is directly thermally coupled to the host card cooling frame, the host card having a single-printed wiring board (PWB) structure, wherein the at least one protrusion is configured to fit into a cut-out in a PWB, wherein a first thickness of the at least one protrusion is configured to be substantially equal to a second thickness of the PWB, and wherein the first thickness and the second thickness are in the direction of the at least one sidewall.

11. The metallic frame of claim 10, further comprising:
a secondary body comprising at least a first secondary body surface substantially parallel to the first main body surface, wherein the secondary body is coupled to the main body by the at least one protrusion.

12. A circuit card assembly comprising:
a host card, the host card having a single-printed wiring board structure, the host card comprising a host card cooling frame;
a mezzanine card of a non-rectangular shape, wherein the mezzanine card is mounted substantially parallel to the host card, the mezzanine card comprising:
a first mezzanine surface with at least one component mounted thereto; and
a second mezzanine surface opposing the first mezzanine surface; and
a mezzanine card cooling frame directly thermally coupled to the host card cooling frame, wherein the mezzanine card cooling frame and the mezzanine card together have joint dimensions conforming to dimensions of a standard, wherein the mezzanine card cooling frame comprises:
a main body;
at least one protrusion; and
at least one sidewall connecting the main body to the at least one protrusion, wherein the at least one protrusion is configured to fit into a cut-out in a single-printed wiring board, wherein a first thickness of the at least one protrusion is configured to be substantially equal to a second thickness of the single-printed wiring board, and wherein the first thickness and the second thickness are in the direction of the at least one sidewall.

13. The circuit card assembly of claim 12, wherein:
the at least one protrusion comprises:
a first protrusion surface at a first level defined by the second mezzanine surface; and
a second protrusion surface opposing the first protrusion surface; and
the mezzanine card comprises at least one cut-out portion configured to receive the at least one protrusion of the mezzanine card cooling frame.

14. The circuit card assembly of claim 13, wherein the second protrusion surface is at a second level defined by the first mezzanine surface.

15. The circuit card assembly of claim 13, wherein the at least one protrusion is substantially rectangular.

16. The circuit card assembly of claim 12, wherein the standard is a VITA standard.

17. The circuit card assembly of claim 13, wherein the mezzanine card cooling frame further comprises:
a secondary body connected to the main body by the at least one protrusion, wherein the secondary body is substantially parallel to the main body.

18. The circuit card assembly of claim 17, wherein:
the at least one component is a plurality of components;
the main body is in contact with a first component of the plurality of components; and
the secondary body is in contact with a second component of the plurality of components.

* * * * *